(12) United States Patent
Choi et al.

(10) Patent No.: US 11,394,015 B2
(45) Date of Patent: Jul. 19, 2022

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventors: Jun-Ho Choi, Yongin-si (KR); Jin-Koo Chung, Yongin-si (KR); Seong-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/068,773

(22) Filed: Oct. 12, 2020

(65) Prior Publication Data
US 2021/0028411 A1    Jan. 28, 2021

Related U.S. Application Data

(60) Division of application No. 16/265,894, filed on Feb. 1, 2019, now Pat. No. 10,840,481, which is a
(Continued)

(30) Foreign Application Priority Data

Dec. 23, 2011    (KR) .................. 10-2011-0141719

(51) Int. Cl.
    *H01L 51/56*    (2006.01)
    *H01L 51/52*    (2006.01)
    *H01L 27/32*    (2006.01)

(52) U.S. Cl.
    CPC ............ *H01L 51/56* (2013.01); *H01L 27/326* (2013.01); *H01L 27/3258* (2013.01);
    (Continued)

(58) Field of Classification Search
    CPC ............ H01L 27/3246; H01L 27/3248; H01L 27/3258; H01L 27/3276; H01L 27/326;
    (Continued)

(56) References Cited

U.S. PATENT DOCUMENTS 4,885,211 A    12/1989 Tang et al.
5,223,965 A     6/1993 Ota et al.
(Continued)

FOREIGN PATENT DOCUMENTS

CN    101094543 A    12/2007
CN    101242691 A     8/2008
(Continued)

OTHER PUBLICATIONS

Taiwan Office action dated Mar. 29, 2016, with English translation, for corresponding Taiwanese Patent application 101115841, (9 pages).
(Continued)

*Primary Examiner* — Natalia A Gondarenko
(74) *Attorney, Agent, or Firm* — Lewis Roca Rothgerber Christie LLP (57) ABSTRACT

An organic light-emitting display apparatus including: a substrate; a plurality of pixels that are formed on the substrate and each have a light emission area from which visible rays are emitted and a transmission area through which external light is transmitted; a pixel circuit portion disposed in each light emission area of the plurality of pixels; a first electrode that is disposed in each light emission area and is electrically connected to the pixel circuit portion; an intermediate layer that is formed on the first electrode and includes an organic emissive layer; a second electrode formed on the intermediate layer; and a capping layer that is disposed on the second electrode and includes a first capping layer corresponding to the light emission area and a second
(Continued)

capping layer corresponding to the transmission area. Accordingly, electrical characteristics and image quality of the organic light-emitting display apparatus may be improved.

12 Claims, 7 Drawing Sheets

Related U.S. Application Data continuation of application No. 15/365,683, filed on Nov. 30, 2016, now Pat. No. 10,199,611, which is a division of application No. 13/443,820, filed on Apr. 10, 2012, now abandoned.

(52) U.S. Cl.
CPC ...... *H01L 27/3276* (2013.01); *H01L 51/5253* (2013.01); *H01L 2227/323* (2013.01); *H01L 2251/5315* (2013.01)

(58) Field of Classification Search
CPC ............. H01L 27/3262; H01L 51/5203; H01L 51/5228; H01L 51/5212; H01L 51/5237; H01L 51/5253; H01L 51/5256; H01L 51/5262; H01L 51/5268; H01L 51/5271; H01L 51/5281; H01L 51/56; H01L 2227/32; H01L 2227/323; H01L 2251/10; H01L 2251/50; H01L 2251/53; H01L 2251/5315; H01L 2251/5323; H01L 2251/558; H01L 2251/56
USPC ............... 257/28, 59, 71, 72, 40, 88, 98, 99; 438/28, 29
See application file for complete search history.

(56) References Cited

U.S. PATENT DOCUMENTS

| | | | |
|---|---|---|---|
| 6,991,506 B2 | 1/2006 | Yamada et al. |
| 7,839,082 B2 | 11/2010 | Ahn et al. |
| 7,839,083 B2 | 11/2010 | Kubota |
| 8,664,848 B2 | 3/2014 | Jeong et al. |
| 8,872,206 B2 | 10/2014 | Chung et al. |
| 9,490,311 B2 | 11/2016 | Park et al. |
| 2006/0279205 A1 | 12/2006 | Li et al. |
| 2007/0077349 A1 | 4/2007 | Newman et al. |
| 2007/0200496 A1 | 8/2007 | Cok et al. |
| 2008/0048557 A1 | 2/2008 | Birnstock et al. |
| 2008/0197778 A1 | 8/2008 | Kubota |
| 2008/0278063 A1 | 11/2008 | Cok |
| 2008/0287028 A1 | 11/2008 | Ozawa |
| 2009/0179550 A1 | 7/2009 | Koo et al. |
| 2009/0200936 A1* | 8/2009 | Kang .................. H01L 51/5203 313/505 |
| 2009/0278454 A1 | 11/2009 | Fedorovskaya et al. |
| 2010/0001301 A1 | 1/2010 | Karg et al. |
| 2010/0078627 A1 | 4/2010 | Yoshinaga |
| 2010/0127273 A1 | 5/2010 | Kim |
| 2010/0140649 A1 | 6/2010 | Kim et al. |
| 2010/0171106 A1 | 7/2010 | Jung et al. |
| 2010/0221855 A1 | 9/2010 | Yamazaki et al. |
| 2011/0084291 A1 | 4/2011 | Jeong et al. |
| 2011/0169720 A1 | 7/2011 | Hwang et al. |
| 2011/0205198 A1 | 8/2011 | Jeong et al. |
| 2012/0138918 A1 | 6/2012 | Naraoka et al. |

FOREIGN PATENT DOCUMENTS

| | | |
|---|---|---|
| CN | 101242691 B | 8/2008 |
| CN | 102169886 A | 8/2011 |
| CN | 102856505 A | 1/2013 |
| JP | 2008-112112 A | 5/2008 |
| JP | 2010-027504 A | 2/2010 |
| KR | 10-2007-0085377 A | 8/2007 |
| KR | 10-2011-0039056 | 4/2011 |
| KR | 10-2011-0081629 A | 7/2011 |
| TW | 201130372 A | 9/2011 |
| TW | 201138094 A1 | 11/2011 |
| WO | WO 2011043083 A1 | 4/2011 |

OTHER PUBLICATIONS

English Abstract and partial translation of Chinese Publication 101094543 (p. 7), dated Dec. 26, 2007, listed above, (3 pages).

Tong et al., Adhesion in organic electronic structures, 2009, Journal of Applied Physics 106, 083708-8.

Huang et al., Highly efficient top emitting organic light-emitting diodes with organic outcoupling enhancement layers, 2006, Applied Physics Letters 88, 113515-3.

Granted Documents issued by Chinese Intellectual Property Office on Jun. 16, 2017 in corresponding Chinese Patent Application No. 201210299171.X, 19 pages.

* cited by examiner

FIG. 9

ORGANIC LIGHT-EMITTING DISPLAY APPARATUS AND METHOD OF MANUFACTURING THE SAME

CROSS-REFERENCE TO RELATED PATENT APPLICATIONS

This application is a divisional of U.S. patent application Ser. No. 16/265,894, filed Feb. 1, 2019, which is a continuation of U.S. patent application Ser. No. 15/365,683, filed Nov. 30, 2016, now U.S. Pat. No. 10,199,611, which is a divisional application of U.S. patent application Ser. No. 13/443,820, filed Apr. 10, 2012, which claims priority to and the benefit of Korean Patent Application No. 10-2011-0141719, filed Dec. 23, 2011, the entire content of all of which is incorporated herein by reference.

BACKGROUND

1. Field

The following description relates to an organic light-emitting display apparatus and a method of manufacturing the same.

2. Description of the Related Art

Flat panel display apparatuses are thin and portable display apparatuses. Among the flat panel display apparatuses, organic light-emitting display apparatuses are self-emissive display apparatuses which have wide viewing angles, excellent contrast, and high response speeds. Thus, the organic light-emitting display apparatuses are being recognized (noticed) as next-generation display apparatuses.

An organic light-emitting display apparatus includes an intermediate layer, a first electrode, and a second electrode. The intermediate layer includes an organic emissive layer, and when a voltage is applied to the first and second electrodes, the organic emissive layer produces visible rays.

Here, due to a sealing member disposed on the second electrode or other impurities, the second electrode may be polluted or damaged.

Thus, it is difficult to improve image quality and electrical characteristics of the organic light-emitting display apparatus.

SUMMARY

Aspects of embodiments of the present invention are directed toward an organic light-emitting display apparatus having improved electrical characteristics and/or image quality, and a method of manufacturing the organic light-emitting display apparatus.

According to an embodiment of the present invention, there is provided an organic light-emitting display apparatus including: a substrate; a plurality of pixels that are formed on the substrate and each have a light emission area from which visible rays are emitted and a transmission area through which external light is transmitted; a pixel circuit portion disposed in each light emission area of the plurality of pixels; a first electrode that is disposed in each light emission area and is electrically connected to the pixel circuit portion; an intermediate layer that is formed on the first electrode and includes an organic emissive layer; a second electrode formed on the intermediate layer; and a capping layer that is disposed on the second electrode and includes a first capping layer corresponding to the light emission area and a second capping layer corresponding to the transmission area.

The capping layer may be light-transmissive.

The first capping layer and the second capping layer may have different thicknesses.

The second capping layer may be thinner than the first capping layer.

The second capping layer may include a plurality of sub-capping layers.

The first capping layer and the second capping layer may be separated from each other in at least a first direction and a second direction perpendicular to the first direction (or in at least one area).

The first capping layer and the second capping layer may include the same material.

The first capping layer and the second capping layer may include different materials.

The capping layer may comprise 8-quinolinolato lithium (Liq), N,N-diphenyl-N,N-bis(9-phenyl-9H-carbazol-3-yl) biphenyl-4,4'-diamine, N(diphenyl-4-yl)9,9-dimethyl-N-(4 (9-phenyl-9H-carbazol-3-yl)phenyl)-9H-fluorene-2-a mine, or 2-(4-(9,10-di(naphthalene-2-yl)anthracene-2-yl)phenyl)-1-phenyl-1H-benzo-[D]imidazole.

The second electrode may be light-transmissive.

The capping layer may be formed on the second electrode in a first area and has a first edge, the organic light-emitting display apparatus may further include a third electrode that is formed on the second electrode in a second area other than the first area (or in an entire top surface area of the second electrode except the first area) and has a second edge, and a lateral surface of the first edge of the capping layer and a lateral surface of the second edge of the third electrode contact each other.

The third electrode may be is thicker than the second electrode.

An adhesive force between the third electrode and the capping layer may be weaker than an adhesive force between the third electrode and the second electrode.

The third electrode may comprise magnesium (Mg).

All edges of the capping layer and an edge of the third electrode may contact each other.

According to another embodiment of the present invention, there is provided a method of manufacturing an organic light-emitting display apparatus including a plurality of pixels each including a light emission area from which visible rays are emitted and a transmission area through which external light is transmitted, the method comprising: forming a plurality of pixel circuit portions on a substrate to respectively correspond to the plurality of pixels; forming a first electrode that is disposed in a light emission area of each of the plurality of pixels and is electrically connected to a corresponding one of the pixel circuit portions; forming an intermediate layer, including an organic emissive layer, on the first electrode; forming a second electrode on the intermediate layer; and forming a capping layer on the second electrode, wherein the capping layer comprises a first capping layer corresponding to the light emission area and a second capping layer corresponding to the transmission area.

The first capping layer and the second capping layer may be formed separately.

The first capping layer and the second capping layer may be formed using a mask.

The capping layer may be formed in a first area on the second electrode and have a first edge, the method may further include forming a third electrode that is formed in a second area other than the first area on the second electrode and has a second edge, and a lateral surface of the first edge of the capping layer and a lateral surface of the second edge of the third electrode are formed to contact each other.

The forming of the third electrode may comprise patterning the third electrode by using a pattern of the capping layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. As used herein, the term "and/or" includes any and all combinations of one or more of the associated listed items. Expressions such as "at least one of," when preceding a list of elements, modify the entire list of elements and do not modify the individual elements of the list.

Figure 1:
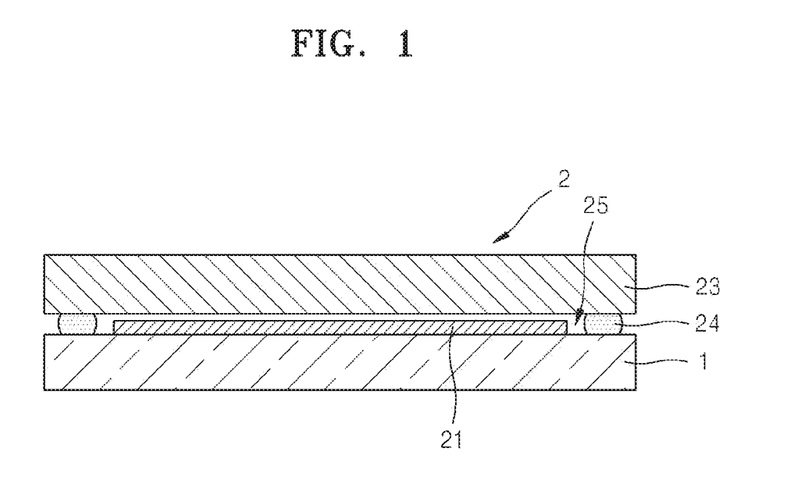
FIG. 1 is a cross-sectional view illustrating an organic light-emitting display apparatus according to an embodiment of the present invention.

FIG. 1 is a cross-sectional view illustrating an organic light-emitting display apparatus 2 according to an embodiment of the present invention.

Referring to FIG. 1, the organic light-emitting display apparatus 2 includes a substrate 1, an organic light-emitting unit 21 formed on the substrate 1, and an encapsulation substrate 23 that encapsulates the organic light-emitting unit 21.

The encapsulation substrate 23 includes a transparent material so that visible rays generated by the organic light-emitting unit 21 may transmit therethrough, and prevents (blocks) penetration of external air and water into the organic light-emitting unit 21.

The substrate 1 and the encapsulation substrate 23 are coupled using a sealing member 24 so that space 25 between the substrate 1 and the encapsulation substrate 23 is encapsulated. A moisture absorbing material or filler may be included in the space 25.

Figure 2:
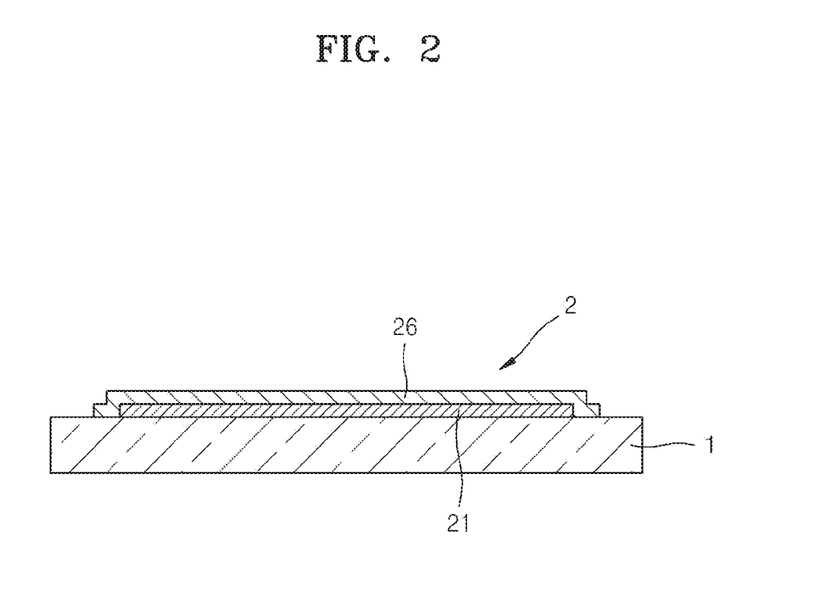
FIG. 2 is a cross-sectional view illustrating an organic light-emitting display apparatus according to another embodiment of the present invention.

FIG. 2 is a cross-sectional view illustrating an organic light-emitting display apparatus 2 according to another embodiment of the present invention. Instead of the encapsulation substrate 23 of FIG. 1, a thin encapsulation layer 26 may be formed on an organic light-emitting unit 21, as illustrated in FIG. 2, to protect the organic light-emitting unit 21 from external air. The encapsulation layer 26 may have a structure in which an inorganic layer formed of silicon oxide or silicon nitride or the like and an organic layer formed of epoxy or polyimide or the like are alternately stacked, but is not limited thereto. Any encapsulation structure that is a thin transparent layer may be used.

Figure 3:
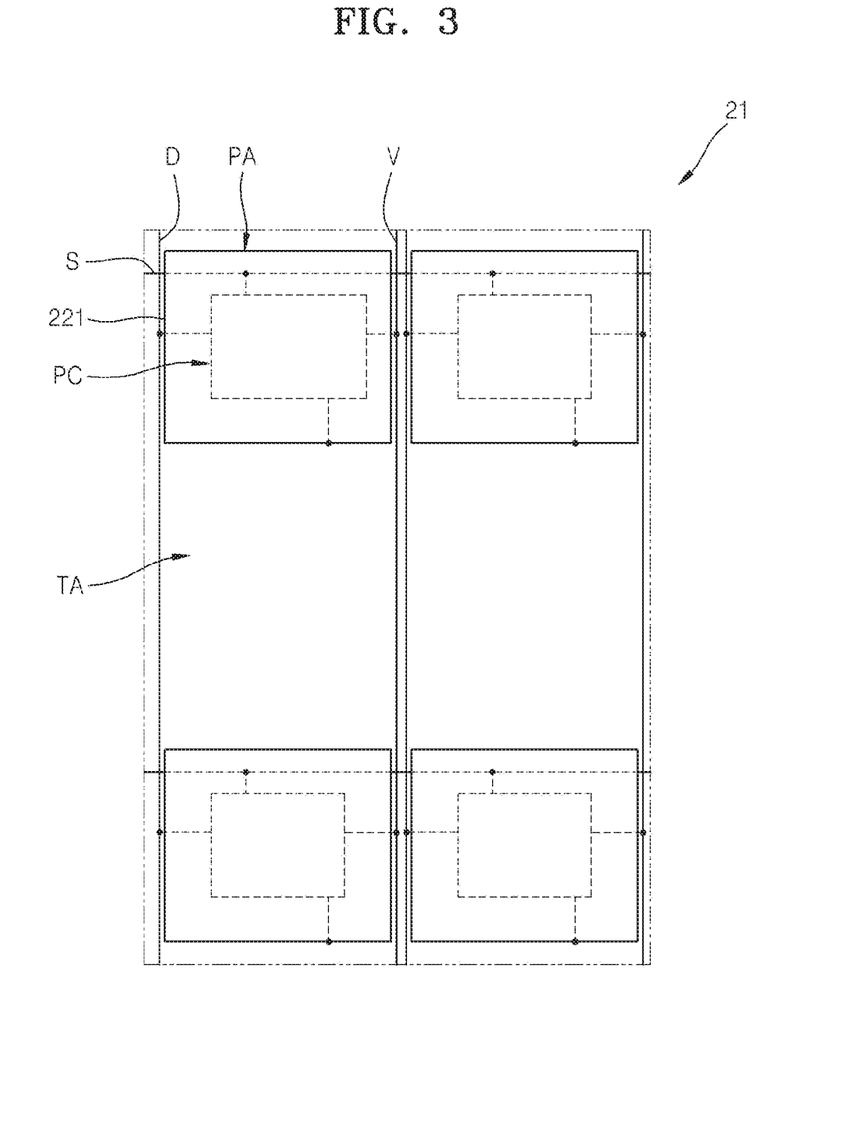
FIG. 3 is a plan view illustrating an organic light-emitting unit of FIG. 1.
Figure 4:
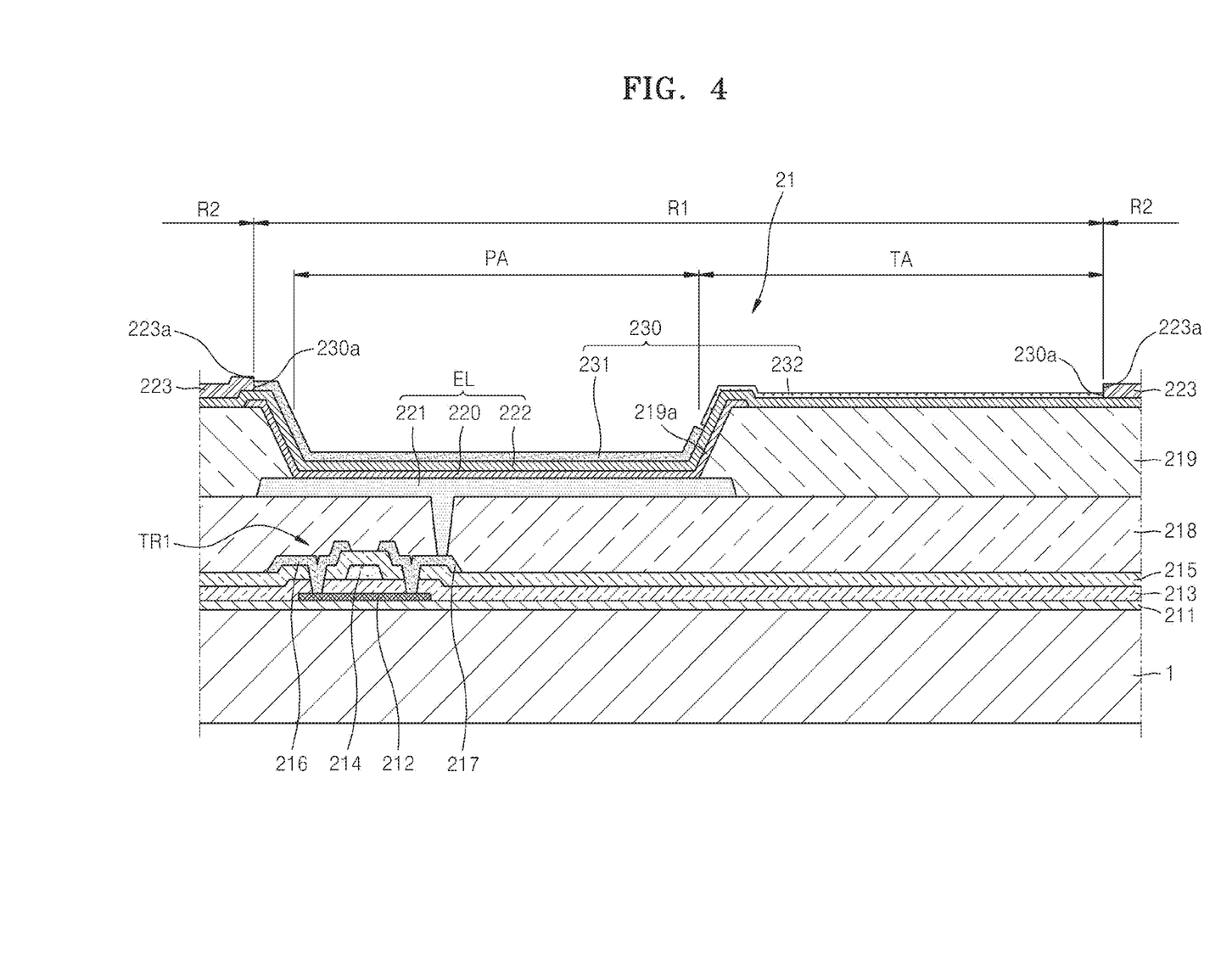
FIG. 4 is a cross-sectional view illustrating a pixel of FIG. 3.

FIG. 3 is a plan view illustrating the organic light-emitting unit 21 of FIG. 1, and FIG. 4 is a cross-sectional view illustrating a pixel of FIG. 3.

Referring to FIGS. 3 and 4, the organic light-emitting unit 21 is divided into a transmission area TA through which external light is transmitted and a plurality of light emission areas PA that are adjacent to the transmission area TA.

As illustrated in FIG. 3, in each of the light emission areas PA, a pixel circuit portion PC is included and a plurality of conductive lines, such as a scan line S, a data line D, and a Vdd line V, are electrically connected to the pixel circuit portion PC. Although not illustrated in FIG. 3, other conductive lines besides the scan line S, the data line D, and the Vdd line V may be included according to the configuration of the pixel circuit portion PC.

In FIG. 3, the pixel circuit portion PC may include at least one thin film transistor connected to the scan line S and the data line D, a thin film transistor connected to the Vdd line V, or the like, and a capacitor. The thin film transistors of the pixel circuit portion PC may include a switching transistor and a driving transistor. Also, the thin film transistors of the pixel circuit portion PC may be either p-type or n-type transistor, and the number of capacitors of the pixel circuit portion PC may vary.

Referring to FIG. 3, the scan line S overlaps with a first electrode 221. However, the embodiment of the present invention is not limited thereto, and at least one of the plurality of conductive lines, such as the scan line S, the data line D, and the Vdd line V, may be disposed to overlap with the first electrode 221, and also, according to circumstances, all of the plurality of conductive lines, such as the scan line S, the data line D, and the Vdd line V, may overlap with the first electrode 221 or may be disposed next to the first electrode 221.

Referring to FIG. 4, a buffer layer 211 is formed on a substrate 1, and a thin film transistor TR1 is formed on the buffer layer 211.

While only one thin film transistor TR1 is illustrated in FIG. 4, the embodiment of the present invention is not limited thereto, as described above, and a plurality of transistors and at least one capacitor may be included in each pixel.

A semiconductor active layer 212 is formed on the buffer layer 211.

The buffer layer 211 prevents penetration of impurities into the substrate 1 and provides a planar surface over the substrate 1. The buffer layer 211 may be formed of any materials that may perform these functions. For example, the buffer layer 211 may include an inorganic material, such as silicon oxide, silicon nitride, silicon oxynitride, aluminum oxide, aluminum nitride, titanium oxide, or titanium nitride, or an organic material such as polyimide, polyester, or acryl, and may also be formed of a stack structure of such materials. However, the buffer layer 211 is not an essential component and may be omitted when suitable.

The semiconductor active layer 212 may be formed of polycrystalline silicon, but is not limited thereto, and may be formed of an oxide semiconductor. For example, the semiconductor active layer 212 may be a G-I-Z-O layer [$(In_2O_3)$a$(Ga_2O_3)$b$(ZnO)$c layer] (where a, b, and c respectively satisfy a≥0, b≥0, c>0).

A gate insulating layer 213 is formed on the buffer layer 211 to cover the semiconductor active layer 212, and a gate electrode 214 is formed on the gate insulating layer 213.

An interlayer insulating layer 215 is formed to cover the gate electrode 214. A source electrode 216 and a drain electrode 217 are formed on the interlayer insulating layer 215 to be electrically connected to the semiconductor active layer 212.

The thin film transistor TR1 is not limited to the above-described structure, and other thin film transistor structures may be applied. For example, the thin film transistor TR1 described above has a top gate structure, but the thin film transistor TR1 may also have a bottom gate structure in which the gate electrode 214 is disposed below the semiconductor active layer 212. Also, other thin film transistor structures may be used.

A passivation layer 218 is formed on the interlayer insulating layer 215 to cover the pixel circuit portion PC including the thin film transistor TR1. The passivation layer 218 may be a single insulating layer or a plurality of insulating layers having a planarized upper surface. The passivation layer 218 may be formed of an inorganic and/or organic material.

A first electrode 221 that is electrically connected to the thin film transistor TR1 is formed on the passivation layer 218. The first electrode 221 is formed to be in an independent island form in each pixel.

A pixel-defining layer 219 is formed on the passivation layer 218 to cover an edge of the first electrode 221. An opening 219a is formed in the pixel-defining layer 219 to expose a central portion of the first electrode 221 except the edge thereof.

An intermediate layer 220, including an organic emissive layer, is formed on the exposed central portion of the first electrode 221, and a second electrode 222 is formed on the intermediate layer 220 to cover the intermediate layer 220, thereby completing the manufacture of an organic light-emitting device EL.

The intermediate layer 220 may include a low-molecule or polymer organic layer. When the intermediate layer 220 is formed of a low-molecule organic layer, the intermediate layer 220 may include a hole injection layer (HIL), a hole transport layer (HTL), an organic emissive layer, an electron transport layer (ETL), an electron injection layer (EIL), or the like. The organic emissive layer is formed in each of red, green, and blue pixels, and the HIL, the HTL, the ETL, and the EIL are common layers that are commonly applied to the red, green, and blue pixels.

The HIL may be formed of a phthalocyanine compound such as a copper phthalocyanine or a starburst type amine such as TCTA, m-MTDATA, m-MTDAPB or the like.

The HTL may be formed of, for example, N,N'-bis(3-methylphenyl)-N,N'-diphenyl-[1,1-biphenyl]-4,4'-diamine (TPD), N,N'-di(naphthalene-1-il-N,N'-diphenyl benzidine (α-NPD), or the like.

The EIL may be formed of, for example, LiF, NaCl, CsF, $Li_2O$, BaO, or Liq.

The ETL may be formed using Alq3.

The organic emissive layer may include a host material and a dopant material.

The host material of the organic emissive layer may be, for example, tris(8-hydroxy-quinolinato)aluminum (Alq3), 9,10-di(naphti-2-yl)anthracene (AND), 3-Tert-butyl-9,10-di (naphthi-2-yl)anthracene (TBADN), 4,4'-bis(2,2-diphenyl-ethene-1-yl)-4,4'-dimethylphenyl (DPVBi), 4,4'-bisBis(2,2-diphenyl-ethene-1-yl)-4,4'-dimethylphenyl (p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bisBis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bisbis(9-phenyl-9H-carbazole)fluorene (FL-4CBP), 4,4'-bis(carbazole-9-yl)-9,9-di-tolyl-fluorene (DPFL-CBP), or 9,9-bis(9-phenyl-9H-carbazole)fluorene (FL-2CBP).

The dopant material of the organic emissive layer may be, for example, 4,4'-bis[4-(di-p-tolylamino)styryl]biphenyl (DPAVBi), 9,10-di(naph-2-tyl)anthracene (ADN), or 3-tert-butyl-9,10-di(naph-2-tyl)anthracene (TBADN).

The first electrode 221 may function as an anode, and the second electrode 222 may function as a cathode, but the polarities of the first and second electrodes 221 and 222 may be exchanged.

When the first electrode 221 functions as an anode, the first electrode 221 may include a material having a high work function, such as ITO, IZO, ZnO, or $In_2O_3$. Also, according to purpose or design, the first electrode 221 may further include a reflection layer formed of, for example, Ag, Mg, Al, Pt, Pd, Au, Ni, Nd, Ir, Cr, Li, Yb, or Ca.

When the second electrode 222 functions as a cathode electrode, the second electrode 222 may be formed of a metal, such as Ag, Mg, Al, Pt, Pd, Au, Ni, Nd, Ir, Cr, Li, or Ca. When the organic light-emitting display apparatus 2 is a top emissive type display apparatus in which an image is formed away from the substrate 1, light needs to be transmitted through the second electrode 222. To this end, the second electrode 222 may include a transparent metal oxide, such as ITO, IZO, ZnO, or $In_2O_3$. Alternatively, the second electrode 222 may be formed as a thin film by using Al, Ag, and/or Mg. For example, the second electrode 222 may be formed in a single-layer structure or a stack structure including Mg:Ag and/or Ag. Unlike the first electrode 221, the second electrode 222 is formed such that a common voltage is applied to each of all pixels thereof, and to this end, the second electrode 222 is formed as a common electrode to all pixels and is not formed of a plurality of patterns to correspond to pixels. Alternatively, the second electrode 222, which is the common electrode, may also be patterned into a mesh form, from which portions except those corresponding to a light emission area are removed.

When the second electrode 222 is formed as a common electrode, surface resistance of the second electrode 222 is increased, thereby causing voltage drop (IR drop). According to the current embodiment of the present invention, to solve this issue, a third electrode 223 that is electrically connected to the second electrode 222 may be further included.

In addition, an upper surface of the second electrode 222 may be damaged by the encapsulation substrate 23 of FIG. 1. Moreover, when forming the encapsulation layer 26 as illustrated in FIG. 2, the second electrode 222 is likely to be damaged when forming the encapsulation layer 26. Also, the second electrode 222 is likely to be damaged by external air or impurities. According to the current embodiment of the present invention, a capping layer 230 may be formed on the second electrode 222.

The capping layer 230 includes a first capping layer 231 and a second capping layer 232. The first capping layer 231 may be formed to correspond to the light emission area PA, and the second capping layer 232 may be formed to correspond to the transmission area TA. Also, the first capping layer 231 and the second capping layer 232 may be formed separately. In more detail, the thicknesses of the first capping layer 231 and the second capping layer 232 may be different, and in particular, a thickness of the second capping layer 232 may be less than that of the first capping layer 231.

The capping layer 230 is formed on the second electrode 222 in a first area R1 and has a first edge 230a.

The third electrode 223 is formed on the second electrode 222 in a second area R2 and has a second edge 223a. The third electrode 223 is adjacent and horizontal to the capping layer 230.

The first area R1 corresponds to the light emission area PA and the transmission area TA in at least one pixel, and an edge of the first area R1 is the first edge 230a of the capping layer 230. The second area R2 corresponds to a portion of the second electrode 222 other than (or except) the first area R1, the third electrode 223 is formed over the entire second area R2, and an edge of the second area R2 is the second edge 223a of the third electrode 223. The second area R2 is an area except at least the light emission area PA.

A lateral surface of the first edge 230a of the capping layer 230 and a lateral surface of the second edge 223a of the third electrode 223 contact each other.

The third electrode 223 may preferably be thicker than the second electrode 222 to reduce surface resistance of the second electrode 222.

The capping layer 230 may preferably be light-transmissive. In particular, in the transmission area TA, desirably, visible rays transmit through the second capping layer 232 as much as possible without losing optical characteristics, and thus, transmittance of the second capping layer 232 may preferably be high.

Also, in the light emission area PA, desirably, visible rays generated by the intermediate layer 220 should transmit through the first capping layer 231 without losing optical characteristics. That is, the first capping layer 231 may preferably be formed such that visible rays generated by the intermediate layer 220 transmit through the first capping layer 231 and image quality, such as luminance, contrast, color conversion, or the like, are considered at the same time.

For example, the second capping layer 232 may be thinner than the first capping layer 231 to improve transparency of the transmission area TA and image quality of the light emission area PA.

The capping layer 230 may be formed as a thin layer that is thinner than the third electrode 223, but is not limited thereto.

According to an embodiment of the present invention, an adhesive force between the third electrode 223 and the capping layer 230 is set to be weaker than an adhesive force between the third electrode 223 and the second electrode 222.

To this end, the capping layer 230 may be formed of a material including 8-quinolinolato lithium (Liq), N,N-diphenyl-N,N-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, or 2-(4-(9,10-di(naphthalene-2-yl)anthracene-2-yl)phenyl)-1-phenyl-1H-benzo-[D]imidazole.

The first capping layer 231 and the second capping layer 232 may be formed using the same material for simplicity of manufacture, but the embodiment of the present invention is not limited thereto, and the first capping layer 231 and the second capping layer 232 may also include different materials.

Also, the third electrode 223 may be formed of magnesium (Mg).

Magnesium (Mg) of the third electrode 223 is a metal, and thus, has a good adhesive property with respect to the second electrode 222. However, Mg is not easily adhered to the material of the capping layer 230. Thus, the third electrode 223 may be easily patterned by using the adhesive force between the third electrode 223 and the capping layer 230.

As described above, the third electrode 223 is patterned so that the third electrode 223 is formed only in the second area R2. However, after forming the intermediate layer 220 of the organic light-emitting device EL, the third electrode 223 may not be patterned using a wet process such as a photolithography method which is frequently used as a patterning method of a typical metal layer, because when water and/or oxygen penetrates into the intermediate layer 220 in the wet process, the lifespan (lifetime) of the organic light-emitting device EL is abruptly decreased.

Thus, it is difficult to pattern the third electrode 223 in actuality.

According to the current embodiment of the present invention, the third electrode 223 may be simply patterned using an adhesive force between the third electrode 223 and the capping layer 230. Hereinafter, a method of manufacturing the capping layer 230, according to an embodiment of the present invention, will be described in more detail.

First, the manufacturing method is the same until forming the second electrode 222, and then a mask is used to form the capping layer 230. The capping layer 230 may be formed of an organic material described above, and thus, may be formed using a thermal evaporation method using a mask. An opening is formed in the mask to correspond to a pattern of the capping layer 230.

Figure 5:
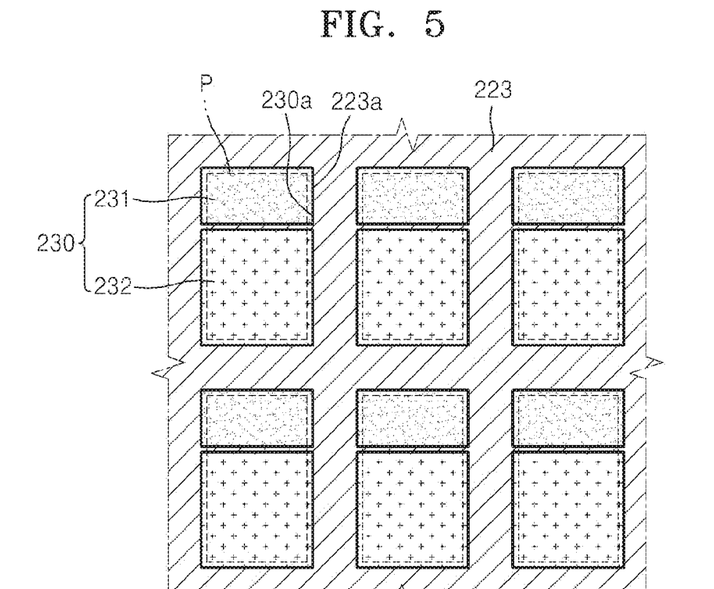
FIG. 5 is a detailed plan view of a capping layer of the organic light-emitting unit of FIG. 1, according to an embodiment of the present invention.

Here, the first capping layer 231 and the second capping layer 232 are formed separately. That is, the first capping layer 231 is formed using a mask having an opening corresponding to the first capping layer 231, and then the second capping layer 232 is formed using a mask having an opening corresponding to the second capping layer 232. Referring to FIG. 5, the first capping layer 231 and the second capping layer 232 have different sizes, and in this case, the first capping layer 231 and the second capping layer 232 may be formed using different masks.

However, the embodiment of the present invention is not limited thereto, and when the first capping layer 231 and the second capping layer 232 are to be formed similarly, the first capping layer 231 may be formed first using a mask, and then the mask may be used to form the second capping layer 232.

Alternatively, the first capping layer 231 may be formed after forming the second capping layer 232.

Then, an open mask having an overall opening corresponding to all pixels is used to form the third electrode 223 using a material for forming the third electrode 223. In this case, the material for forming the third electrode 223 has poor adhesive force with respect to the capping layer 230, and thus, is not formed on the capping layer 230, and is formed only on the second electrode 222, which has a relatively good adhesive force.

Accordingly, the third electrode 223 may be spontaneously (naturally) patterned at a desired position without an additional patterning operation such as a photolithography method.

FIG. 5 is a detailed plan view of the capping layer 230 of the organic light-emitting unit 21 of FIG. 1, according to an embodiment of the present invention. As illustrated in FIG. 5, the capping layer 230 may be formed to be in an island form in each pixel P. The first capping layer 231 and the second capping layer 232 are formed separately, and thus, may be spaced apart from each other. However, the embodiment of the present invention is not limited thereto, and the first capping layer 231 and the second capping layer 232 may be formed adjacent to each other or may overlap by a portion, particularly, edge portions thereof.

The third electrode 223 is arranged as a lattice pattern between pixels P.

Figure 6:
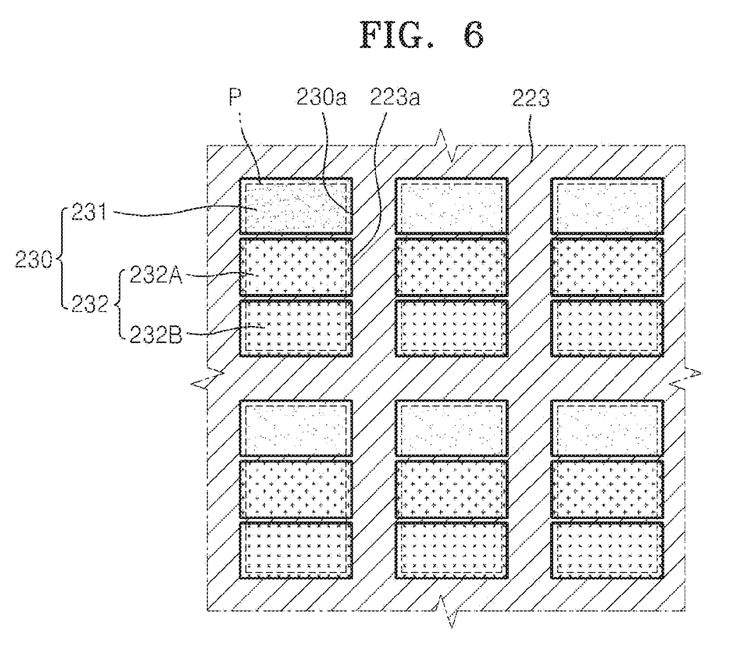
FIG. 6 is a plan view of a capping layer of the organic light-emitting unit, according to another embodiment of the present invention.

FIG. 6 is a plan view of a capping layer 230 of the organic light-emitting unit 21 according to another embodiment of the present invention. In FIG. 6, as an example of the capping layer 230 of the organic light-emitting unit 21 of FIG. 1, the second capping layer 232 of the capping layer 230 may include sub-capping layers 232A and 232B. In this case, when forming the capping layer 230, the first capping layer 231, the sub-capping layer 232A, and the sub-capping layer 232B may be sequentially formed. That is, the capping layer 230 may be formed by three operations. The capping layer 230 may also be formed using a single mask. A boundary between the sub-capping layer 232A and the second sub-capping layer 232B may be in the transmission area.

Also, the sub-capping layers 232A and 232B of the second capping layer 232 include the above-described materials for forming the capping layer 230 and may be formed of the same material. However, the embodiment of the present invention is not limited thereto, and the sub-capping layers 232A and 232B of the second capping layer 232 may also be formed using different materials.

Figure 7:
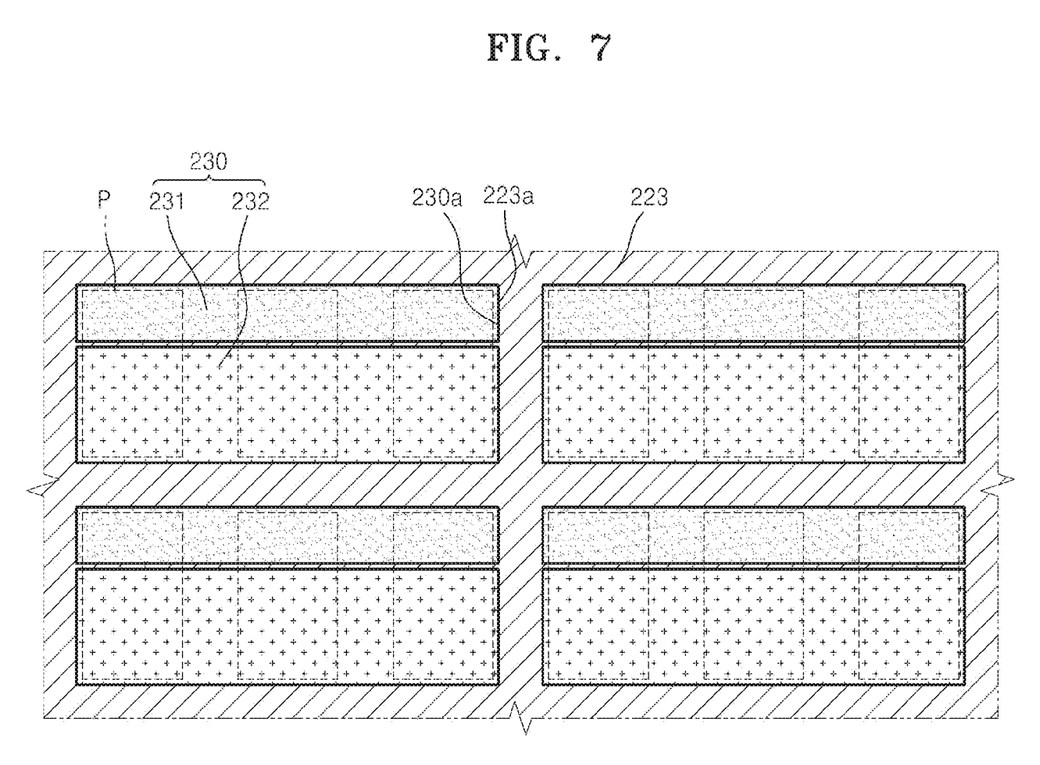
FIG. 7 is a plan view of a capping layer of the organic light-emitting unit, according to another embodiment of the present invention.

Also, according to another embodiment of the present invention, the capping layer 230 of the organic light-emitting unit 21 of FIG. 1 may be formed to be in an island form in a plurality of pixels P as illustrated in FIG. 7. In this case, the third electrode 223 is arranged as a lattice pattern that passes by spaces between the plurality of pixels P. Although not illustrated in FIG. 7, the second capping layer 232 of the capping layer 230 may also include a plurality of sub-capping layers, as illustrated in FIG. 6.

Although not illustrated in the drawings, when forming the third electrode 223, a material for forming the third electrode 223 may be formed not only in an area except the capping layer 230, but also as a thin layer that is thinner than the third electrode 223 formed in the area except the capping layer 230, since the material for forming the third electrode 223 has poor adhesive force with respect to the capping layer 230. That is, the material should theoretically not form as a layer on the capping layer 230. In addition, even if the material is formed as a layer only on the second electrode 222 having a relatively good adhesive force, the material for forming the third electrode 223 is deposited without using an additional patterning mask but using an open mask. Consequently, a very thin layer may be formed on the capping layer 230 in a physically unstable state.

However, since the material for forming the third electrode 223, which may be formed on the capping layer 230, is very thin, the material does not have a great influence on the luminance of the organic light-emitting device EL.

According to the current embodiment of the present invention, as the light emission area PA and the transmission area TA are separate, when observing the outside through the transmission area TA, distortion of external images generated due to diffusion of external light related to patterns of devices in the pixel circuit portion PC may be reduced or prevented.

The light emission area PA and the transmission area TA are formed such that a ratio of a surface area of the transmission area TA with respect to the total surface area of the light emission area PA and the transmission area TA is in a range from about 5% to about 90%.

In one embodiment, if the ratio of the surface area of the transmission area TA with respect to the total surface area of the light emission area PA and the transmission area TA is less than 5%, the amount of light that is transmitted through the transmission area TA may be small, and thus, a viewer may have difficulty viewing an object or an image on the opposite side of the organic light-emitting display apparatus 2. That is, the organic light-emitting unit 21 may not be regarded as transparent. However, even if the ratio of the surface area of the transmission area TA with respect to the total surface area of the light emission area PA and the transmission area TA is about 5%, if an intensity of external light is high, a user may sufficiently recognize an object or an image disposed on the opposite side, through the organic light-emitting display apparatus 2, and thus, the user may regard the organic light-emitting unit 21 as a transparent display unit. In addition, when the thin film transistor of the pixel circuit portion PC is formed as a transparent thin film transistor, such as an oxide semiconductor, and an organic light-emitting device is also formed of a transparent device, the effect of the organic light-emitting display apparatus 2 as a transparent display apparatus may be enhanced.

In another embodiment, if the ratio of the surface area of the transmission area TA with respect to the total surface area of the light emission area PA and the transmission area TA is greater than 90%, pixel integration of the organic light-emitting unit 21 is too low and images may not be stably formed through light emission of the light emission area PA. That is, the smaller the surface area of the light emission area PA, the higher the need of luminance of light emitted from the intermediate layer 220. Thus, if an organic light-emitting device is operated in a high luminance mode, the lifespan (lifetime) of the organic light-emitting display apparatus 2 is abruptly decreased.

Thus, the ratio of the surface area of the transmission area TA with respect to the total surface area of the light emission area PA and the transmission area TA may preferably be in a range from 20% to 70%.

In one embodiment, if the ratio is less than 20%, the surface area of the light emission area PA is exceedingly greater than that of the transmission area TA, and a user has difficulty viewing images outside through the transmission area TA. In another embodiment, if the ratio exceeds 70%, designing the pixel circuit portion PC, which is to be arranged in the light emission area PA, may be restricted too much.

The first electrode 221 that is electrically connected to the pixel circuit portion PC is included in the light emission area PA, and the pixel circuit portion PC overlaps with the first electrode 221 so as to be covered by the first electrode 221. In addition, at least one of the conductive lines, including the scan line S, the data line D, and the Vdd line V, described above may be arranged to cross the first electrode 221.

However, since a ratio at which these conductive lines hinder transmittance is less than that of the pixel circuit portion PC, all of the conductive lines may be disposed adjacent to the first electrode 221 according to design conditions.

As described above, if the first electrode 221 includes a reflection layer formed of a conductive metal on which light may be reflected, the first electrode 221 covers the pixel circuit portion PC and reduces or prevents distortion of external images in the light emission area PA due to the pixel circuit portion PC.

Also, according to the current embodiment of the present invention, as illustrated in FIGS. 3 and 4, the light emission area PA and the transmission area TA are arranged in the first area R1. The capping layer 230 is disposed within the first area R1, and thus, covers both the light emission area PA and the transmission area TA. In addition, the third electrode 223 is formed in the second area R2 outside the first area R1.

In addition, a transmission window may be formed by removing a portion of the second electrode 222 from the transmission area TA, thereby further increasing light transmittance of the transmission area TA. Here, the transmission window is not limited to being formed by removing a portion of the second electrode 222 and may also be formed on at least one of the pixel-defining layer 219, the passivation layer 218, the interlayer insulating layer 215, the gate insulating layer 213, and the buffer layer 211.

Figure 8:
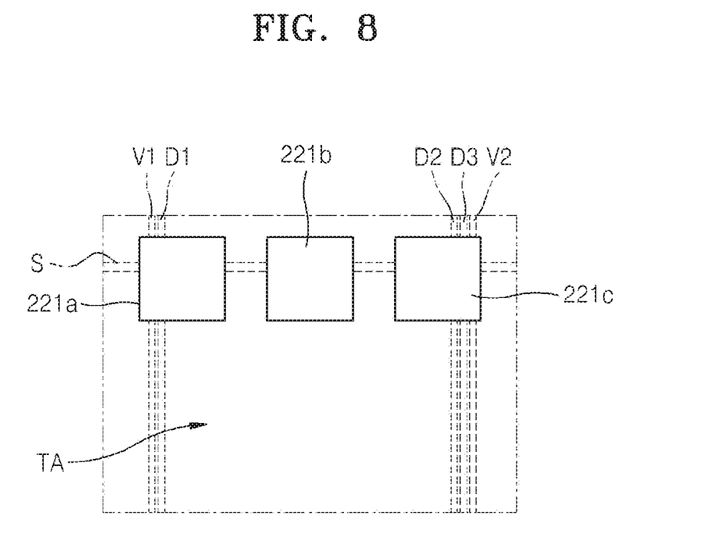
FIG. 8 is a plan view illustrating an organic light-emitting unit according to another embodiment of the present invention.

FIG. 8 is a plan view illustrating an organic light-emitting unit according to another embodiment of the present invention.

Referring to FIG. 8, each pixel is formed of red, green, and blue sub-pixels so as to emit white light. However, white light may also be generated by using colors other than red, green, and blue colors.

In this case, one transmission area TA for each of first electrodes 221a, 221b, and 221c of the three sub-pixels is formed. First through third data lines D1 through D3 are electrically connected to the first electrodes 221a, 221b, and 221c of the three sub-pixels. Also, a first Vdd line V1 is electrically connected to the first electrodes 221a and 221b, and a second Vdd line V2 is electrically connected to the first electrode 221c.

In this structure, one large transmission area TA is included for a plurality of sub-pixels, and thus, transmittance of the entire display apparatus may be further increased and distortion of images due to light diffusion may also be further reduced.

Here, one large transmission window may also be formed by removing at least a portion of a second electrode from the transmission area TA, as described above. The transmission window is not limited to the removed portion of the second electrode but may also be formed on at least one of a pixel-defining layer, a passivation layer, an interlayer insulating layer, a gate insulating layer, and a buffer layer.

A capping layer and a third electrode are also formed in the embodiment of FIG. 8 described above. That is, a capping layer is formed to correspond to a transmission area and a light emission area, and the third electrode is formed around the capping layer. Also, a first capping layer is formed in the light emission area, and a second capping layer is formed in the transmission area. The light emission area of FIG. 8 may be regarded as corresponding to areas of the first electrodes 221a, 221b, and 221c. The other detailed configuration is the same as the previous embodiment(s), and thus, description thereof is omitted.

Figure 9:
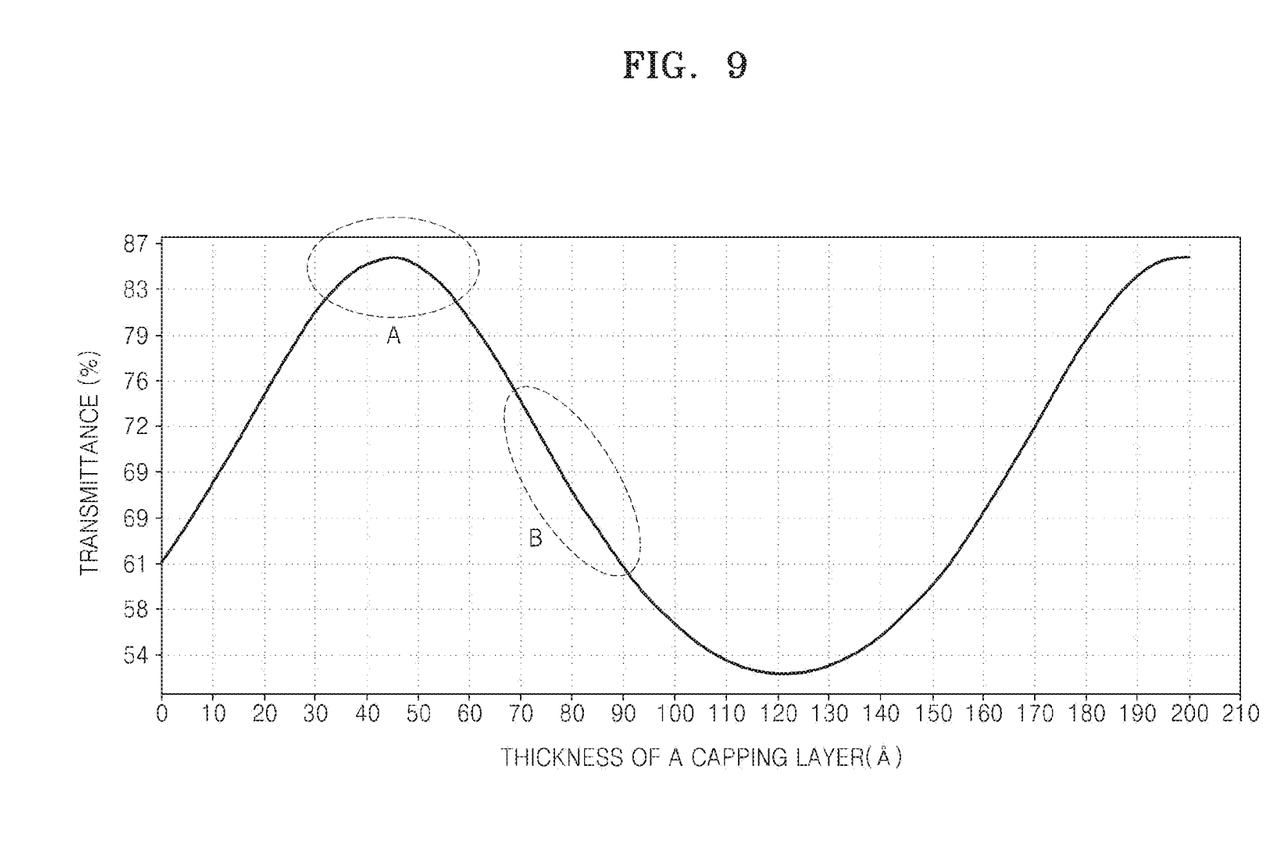
FIG. 9 is a graph showing light transmittance according to thickness of a capping layer.

FIG. 9 is a graph showing light transmittance according to thickness of a capping layer. Referring to FIG. 9, an area A has a large transmittance, and an area B has a lower light transmittance than the area A.

As described above, the first capping layer 231 and the second capping layer 232 of the capping layer 230 are separately formed.

Visible rays transmit through the transmission area TA, and transmittance of the second capping layer 232 may preferably be high. However, the second electrode 222 below the second capping layer 232 may preferably be formed such that a thickness of the second capping layer 232 is sufficient to protect the second electrode 222. In more detail, the second capping layer 232 may have a thickness corresponding to the area A, that is, a range from about 30 Å to about 60 Å.

In the light emission area PA, an image is formed through visible rays generated by the intermediate layer 220, and thus, a suitable thickness of the first capping layer 231 is determined in consideration of luminance, contrast, and color conversion of visible rays. In more detail, the first capping layer 231 may have a thickness corresponding to the area B, that is, a range from about 70 Å to about 90 Å.

As a result, the first capping layer 231 is thicker than the second capping layer 232.

However, this is an example, and alternatively, the first capping layer 231 and the second capping layer 232 may be each formed to have suitable thicknesses. In more detail, considering optical characteristics, the organic light-emitting display apparatus 2 may suitably vary according to the material of the intermediate layer 220, and a suitable thickness of the first capping layer 231 may vary accordingly. Also, different materials may be determined to form the first capping layer 231 and the second capping layer 232, and a range of suitable thicknesses thereof may also vary.

As described above, a voltage drop of the second electrode 222 is reduced or prevented by using the third electrode 223 to improve electrical characteristics of the organic light-emitting display apparatus 2, thereby improving image quality of the organic light-emitting display apparatus 2.

Also, the second electrode 222 is protected by using the capping layer 230 to, e.g., completely prevent deterioration of electrical characteristics and image quality of the organic light-emitting display apparatus 2 due to damage of the second electrode 222.

In particular, the third electrode 223 is easily patterned using the capping layer 230 to increase manufacturing simplicity and prevent damage of the organic light-emitting device EL when forming the third electrode 223.

Also, the capping layer 230 includes the first capping layer 231 and the second capping layer 232, and the first capping layer 231 is formed to correspond to the light emission area PA, and the second capping layer 232 is formed to correspond to the transmission area TA. Accordingly, as many visible rays as possible transmit through the transmission area TA, and suitable images are formed in the light emission area PA. The organic light-emitting display apparatus 2 suitable for use as a transparent display apparatus having excellent image quality and transmittance may be easily manufactured.

According to the organic light-emitting display apparatus and the method of manufacturing the same, electrical characteristics and image quality of the organic light-emitting display apparatus may be easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus comprising a plurality of pixels each comprising a light emission area from which visible rays are emitted and a transmission area through which external light is transmitted, the method comprising:
   forming a plurality of pixel circuit portions on a surface of a substrate to respectively correspond to the plurality of pixels;
   forming a first electrode in a light emission area of each of the plurality of pixels, the first electrode being electrically connected to a corresponding one of the pixel circuit portions;
   forming an intermediate layer, comprising an organic emissive layer, on the first electrode;
   forming a second electrode on the intermediate layer;
   forming a first capping layer on the second electrode corresponding to the light emission area;
   forming a second capping layer on the second electrode corresponding to the transmission area, and
   wherein the second capping layer is formed separately from the first capping layer; and
   wherein the first capping layer is thicker than the second capping layer.

2. The method of claim 1, wherein at least one of the first capping layer or the second capping layer is formed using a mask.

3. The method of claim 1, wherein:
   the method further comprises forming a third electrode in an area on the second electrode, and
   at least a region of a lateral surface of the first capping layer or the second capping layer is formed to contact a lateral surface of the third electrode.

4. The method of claim 3, wherein the forming of the third electrode comprises patterning the third electrode by using a pattern of the first capping layer or the second capping layer.

5. The method of claim 1, wherein the first capping layer is formed to extend to one region of the transmission area.

6. The method of claim 1, wherein a distance from the substrate to the first capping layer is different from a distance from the substrate to the second capping layer.

7. A method of manufacturing an organic light-emitting display apparatus comprising a plurality of pixels each comprising a light emission area from which visible rays are emitted and a transmission area through which external light is transmitted, the method comprising:
   forming a plurality of pixel circuit portions on a surface of a substrate to respectively correspond to the plurality of pixels;
   forming a first electrode in a light emission area of each of the plurality of pixels, the first electrode being electrically connected to a corresponding one of the pixel circuit portions;
   forming an intermediate layer, comprising an organic emissive layer, on the first electrode;
   forming a second electrode on the intermediate layer;
   forming a first capping layer on the second electrode corresponding to the light emission area; and
   forming a second capping layer on the second electrode corresponding to the transmission area, and
   wherein the second capping layer is formed separately from the first capping layer; and
   wherein the first capping layer is formed to extend from one pixel of the plurality of pixels to another pixel of the plurality of pixels, and the second capping layer is formed to extend from one pixel of the plurality of pixels to another pixel of the plurality of pixels.

8. The method of claim 7, wherein at least one of the first capping layer or the second capping layer is formed using a mask.

9. The method of claim 7, wherein:
   the method further comprises forming a third electrode in an area on the second electrode, and
   at least a region of a lateral surface of the first capping layer or the second layer is formed to contact a lateral surface of the third electrode.

10. The method of claim 9, wherein the forming of the third electrode comprises patterning the third electrode by using a pattern of the first capping layer or the second capping layer.

11. The method of claim 7, wherein the first capping layer is formed to extend to one region of the transmission area.

12. The method of claim 7, wherein a distance from the substrate to the first capping layer is different from a distance from the substrate to the second capping layer.

* * * * *